United States Patent
Earls

(12) 
(10) Patent No.: US 6,785,527 B2
(45) Date of Patent: Aug. 31, 2004

(54) CONVERSION SPUR AVOIDANCE IN A MULTI-CONVERSION RADIO FREQUENCY RECEIVER

(75) Inventor: Jeffrey D. Earls, Forest Grove, OR (US)

(73) Assignee: Tektronix, Inc., Beaverton, OR (US)

( * ) Notice: Subject to any disclaimer, the term of this patent is extended or adjusted under 35 U.S.C. 154(b) by 645 days.

(21) Appl. No.: 09/825,308

(22) Filed: Apr. 2, 2001

(65) Prior Publication Data

US 2002/0142748 A1 Oct. 3, 2002

(51) Int. Cl.[7] .................................................. H04B 1/26
(52) U.S. Cl. ........................ 455/323; 455/255; 342/30
(58) Field of Search ................................ 455/313, 323, 455/326, 147, 154.1, 205, 209, 255, 257, 259; 332/170; 329/318, 356, 375; 340/554; 342/30

(56) References Cited

U.S. PATENT DOCUMENTS

| | | | |
|---|---|---|---|
| 4,322,856 A | 3/1982 | Ohta et al. | |
| 4,340,974 A | 7/1982 | Cooke et al. | |
| 4,395,777 A | 7/1983 | Oki et al. | |
| 4,512,035 A | 4/1985 | Victor et al. | |
| 4,545,072 A | 10/1985 | Skutta et al. | |
| 4,551,856 A | 11/1985 | Victor et al. | |
| 4,580,289 A | 4/1986 | Enderby | |
| 4,661,995 A | 4/1987 | Kashiwagi | |
| 4,879,758 A | 11/1989 | DeLuca et al. | |
| 5,495,206 A | 2/1996 | Hietala | |
| 5,498,998 A | 3/1996 | Gehrke et al. | |
| 5,640,697 A | 6/1997 | Orndorff | |
| 5,752,174 A | 5/1998 | Matai et al. | |
| 5,890,051 A | 3/1999 | Schlang et al. | |
| 6,002,924 A | 12/1999 | Takano | |

FOREIGN PATENT DOCUMENTS

DE          43 06 578          9/1994

*Primary Examiner*—Tony T. Nguyen
(74) *Attorney, Agent, or Firm*—Francis I. Gray

(57) ABSTRACT

A method of avoiding conversion spurs in a multi-conversion radio frequency receiver having a first local oscillator, an intermediate frequency filter and a second local oscillator in series generates, based on a center frequency for the intermediate frequency filter, a table of problem frequencies of the first local oscillator relative to a frequency of the second local oscillator which produce harmonic mixing products within the bandwidth of the intermediate frequency filter versus corresponding frequency offsets for the second local oscillator which retune the frequency of the second local oscillator so the harmonic mixing products are moved outside the bandwidth of the intermediate frequency filter. In operation when in analyzing an input radio frequency signal the frequency of the first local oscillator equals one of the problem frequencies in the table, the frequency of the second local oscillator is retuned by the corresponding frequency offset from the table, thus moving the harmonic mixing products of the two local oscillators outside the bandwidth of the intermediate frequency filter so they don't affect the analysis of the input radio frequency signal.

5 Claims, 2 Drawing Sheets

CONVERSION SPUR AVOIDANCE IN A MULTI-CONVERSION RADIO FREQUENCY RECEIVER

BACKGROUND OF THE INVENTION

The present invention relates to radio frequency receivers, and more particularly to a method of conversion spur avoidance in a multi-conversion radio frequency receiver.

A multi-conversion radio frequency receiver may use multiple local oscillators when up-converting and down-converting a signal of interest. These separate local oscillators create sum and difference harmonic mixing products between themselves using the various nonlinear elements, primarily mixers and amplifiers, in the receiver. The amplitude of these harmonic mixing products depends on the conversion efficiency of the various elements at the harmonic mixing product frequencies. As a first local oscillator (LO1) is tuned to convert assorted radio frequency (RF) input frequencies to a first intermediate frequency (IF1), the unintended harmonic mixing products of the LO1 frequency with a second local oscillator (LO2) frequency may fall within an IF1 filter bandwidth. When this occurs in a spectrum analyzer instrument, the energy from the unwanted harmonic mixing product, or conversion spur, appears as a real RF signal on a final spectral display.

What is desired is a method of conversion spur avoidance that predicts and avoids unwanted harmonic mixing products from multiple local oscillators in a multi-conversion radio frequency receiver.

BRIEF SUMMARY OF THE INVENTION

Accordingly the present invention provides a method of conversion spur avoidance in a multi-conversion radio frequency receiver by predicting where conversion spurs may occur and retuning a second one of the local oscillators when the predicted conversion spur falls within an IF filter bandwidth of a first one of the local oscillators. During design of the radio frequency receiver a table of problem frequencies for the first local oscillator relative to a frequency of the second local oscillator which produce harmonic mixing products that fall within the bandwidth of the IF filter having a given center frequency IF1 is generated. For each problem frequency and a frequency offset is determined for the second local oscillator which moves the harmonic mixing product out of the IF filter bandwidth. Where the center frequency IF1 of the IF1 filter varies from receiver to receiver, entries into the table are made for each possible IF1 frequency and during calibration of the receiver the IF1 frequency is precisely measured to determine the entries of the table to use during operation. In operation when one of the problem frequencies occurs, the second local oscillator is retuned by the corresponding frequency offset from the table so the harmonic mixing product is moved out of the IF1 filter bandwidth. The direction of the frequency offset for the second local oscillator may be determined by which half of the IF filter bandwidth the harmonic mixing product falls.

The objects, advantages and other novel features of the present invention are apparent from the following detailed description when read in conjunction with the appended claims and attached drawing.

DETAILED DESCRIPTION OF THE INVENTION

Figure 1:
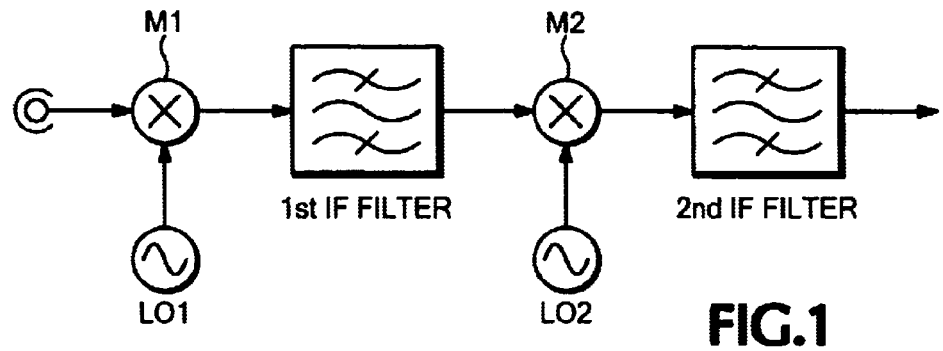
FIG. 1 is a simplified block diagram view of a multi-conversion radio frequency receiver.

When a multi-conversion radio frequency receiver, shown in FIG. 1 having at least two local oscillators LO1, LO2 for up-converting and down-converting a signal of interest via respective mixers M1, M2, is tuned to the first local oscillator frequency LO1 and a harmonic mixing product with the second local oscillator frequency LO2 occurs within the bandwidth of a first IF1 filter, the second local oscillator is retuned slightly to move the harmonic mixing product out of the IF1 filter bandwidth. The amount of retuning required depends on the order of the harmonic mixing product. The higher the order, the faster it moves with LO2 retuning.

Figure 2:
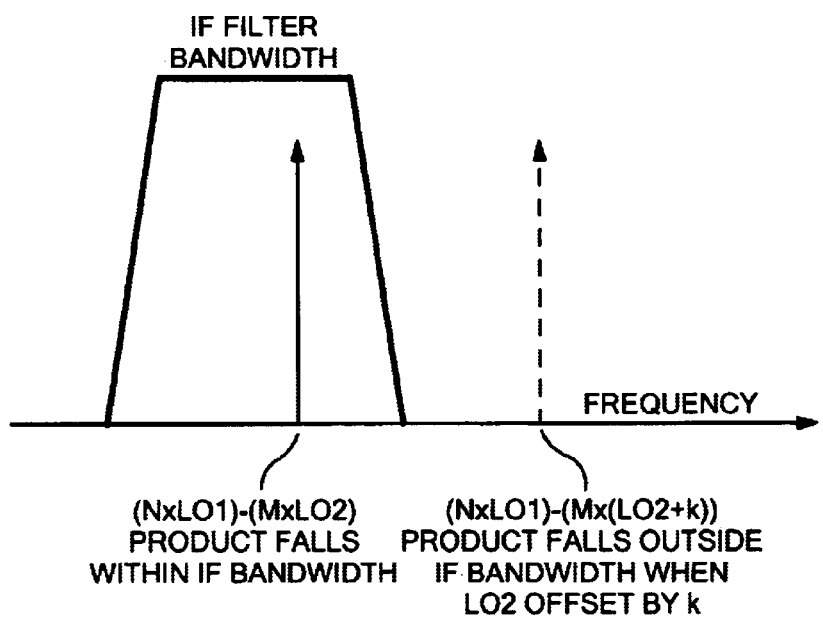
FIG. 2 is a frequency domain view showing a conversion spur within an intermediate frequency bandwidth.
Figure 3:
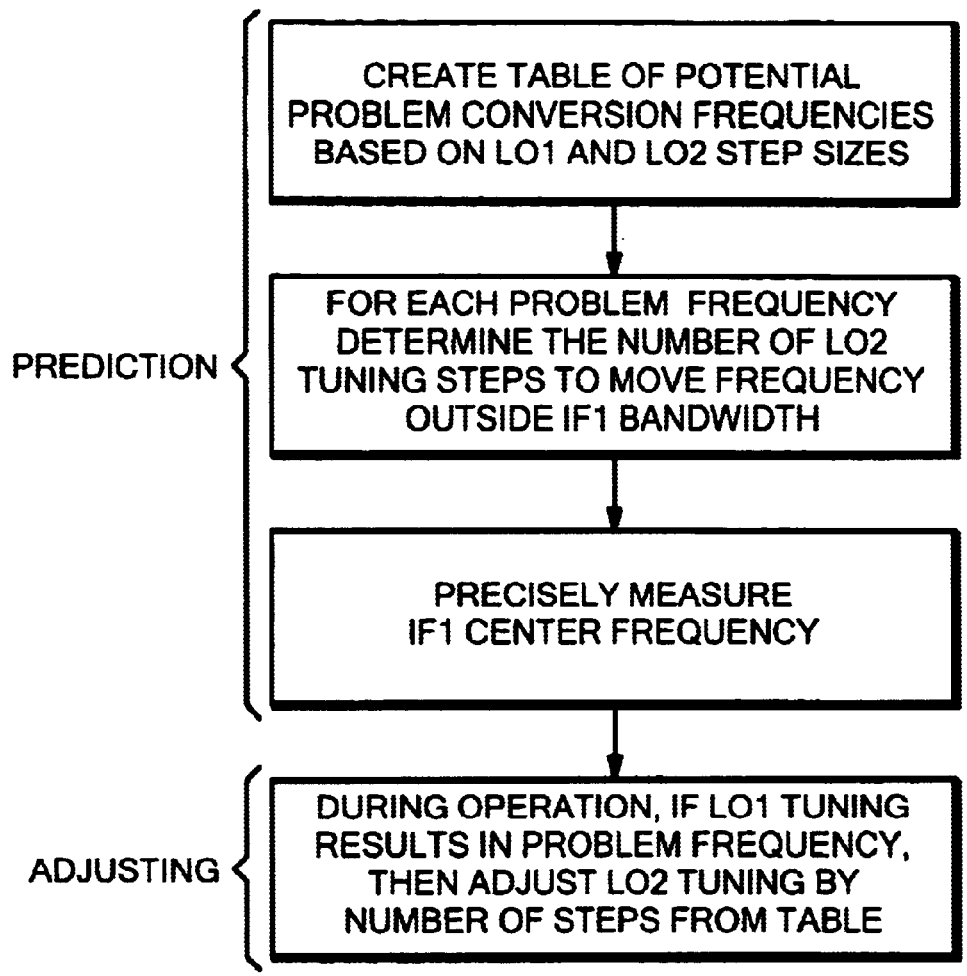
FIG. 3 is a simple flow diagram view of an algorithm for conversion spur avoidance according to the present invention.

A harmonic mixing product appears in the IF1 filter bandwidth if the following equation is satisfied, as shown in FIG. 2:

$$IF1 - IF1BW/2 \leq (N \times LO1) \pm (M \times LO2) \leq IF1 + IF1BW/2$$

where

N is the order of LO1 harmonic (integer)

M is the order of LO2 harmonic (integer)

LO1 is the first local oscillator frequency

LO2 is the second local oscillator frequency

IF1 is the center frequency of the IF filter

IF1BW is the bandwidth of the IF filter

The algorithm described below determines and applies a frequency offset to the LO2 frequency in terms of a number of frequency steps so that the above equation is no longer satisfied:

1. Create a table of potential problem frequencies, i.e., frequencies that produce harmonic mixing products that occur within the IF1BW, based on the LO1 and LO2 frequencies and frequency step sizes and also, if desired for greater precision, on a range of IF1 center frequency values to provide for IF1 center frequency variation from receiver to receiver.
2. Determine as part of the table for each problem frequency the number of LO2 tuning steps required to move the conversion product outside IF1BW.
3. Precisely measure the IF1 center frequency of the receiver to determine which entries in the table to use.
4. During operation, if a fixed or swept tuning of LO1 results in a problem frequency as defined in the table, adjust LO2 by the number of tuning steps for that problem frequency outlined in the table for the measured IF1 center frequency. Make this adjustment only for the acquisition that requires it, then return to nominal LO2 values.

The first two steps of the algorithm may be performed as part of the design of the RF receiver and incorporated into the receiver's data processor and control software. The third step occurs during calibration of the receiver and is used as a pointer into the table for the appropriate entries to use during operation. If the variation from receiver to receiver in the IF1 center frequency is insignificant, the third step may be ignored and the first and second steps applied merely for the nominal IF1 frequency. The fourth step occurs operationally when input signals are being measured. The number of steps to move the LO2 frequency may be minimized by moving the LO2 frequency downward if the spur occurs in the first half of the IF1BW and upward if the spur occurs in the second half of the IF1BW rather than moving the LO2 frequency always in the same direction. This is especially significant for lower order harmonic mixing products where more steps are required to move the spur out of the IF1BW.

After the second conversion the signal of interest is offset from nominal by the same amount that LO2 was adjusted. This requires that the second IF filter, if any, has a bandwidth wide enough to accommodate these variations, making it important to minimize the number of steps required to retune LO2 to minimize the bandwidth of the second IF filter.

This method may be further applied to subsequent stages of conversion if required.

Thus the present invention provides a method of conversion spur avoidance in a multi-conversion radio frequency receiver by predicting when harmonic mixing products between a pair of local oscillators occurs within an IF filter bandwidth and the amount of frequency offset required to retune the second local oscillator to move the harmonic mixing products out of the IF filter bandwidth, and in operation if the first local oscillator is tuned to a frequency that produces such a harmonic mixing product, retuning the second local oscillator frequency by the frequency offset determined by the predicting step.

What is claimed is:

1. A method of conversion spur avoidance in a multi-conversion radio frequency receiver of the type having a first local oscillator, an intermediate frequency filter and a second local oscillator coupled in series for analyzing an input radio frequency signal comprising the steps of:

generating for a nominal center frequency of the intermediate frequency filter a table of problem frequencies for the first local oscillator relative to a frequency of the second local oscillator that produce harmonic mixing products within the bandwidth of the intermediate frequency filter versus corresponding frequency offsets for the second local oscillator sufficient to move the harmonic mixing products outside the bandwidth of the intermediate frequency filter; and in operation when the first local oscillator is tuned to one of the problem frequencies, retuning the frequency of the second local oscillator according to the corresponding frequency offset from the table.

2. The method as recited in claim 1 wherein the generating step further comprises generating the table for a range of center frequencies of the intermediate frequency filter.

3. The method as recited in claim 2 further comprising the step of precisely measuring the center frequency of the intermediate frequency filter.

4. The method as recited in claim 3 wherein the retuning step further comprises selecting the entries from the table as a function of the precisely measured center frequency of the intermediate frequency filter to select the problem frequencies and corresponding frequency offsets.

5. The method as recited in claim 1 wherein the polarity of the frequency offset is a function of which half of the bandwidth of the intermediate frequency filter the harmonic mixing product of the corresponding problem frequency falls.

* * * * *